United States Patent
de Vries (10) Patent No.: US 10,601,373 B2
(45) Date of Patent: Mar. 24, 2020

(54) BOOSTER CIRCUIT INCLUDING DYNAMICALLY SLIDING POWER SUPPLY UNIT

(71) Applicant: TYMPHANY HK LIMITED, Hong Kong (CN)

(72) Inventor: Sebastiaan de Vries, Nijmegen (NL)

(73) Assignee: TYMPHANY HK LIMITED, Wanchai, Hong Kong (CN)

( * ) Notice: Subject to any disclaimer, the term of this patent is extended or adjusted under 35 U.S.C. 154(b) by 0 days.

(21) Appl. No.: 15/475,988

(22) Filed: Mar. 31, 2017

(65) Prior Publication Data
US 2017/0288610 A1    Oct. 5, 2017

Related U.S. Application Data

(60) Provisional application No. 62/315,959, filed on Mar. 31, 2016.

(51) Int. Cl.
| | |
|---|---|
| *H03F 1/02* | (2006.01) |
| *H03F 3/187* | (2006.01) |
| *H03F 3/217* | (2006.01) |
| *H04R 3/00* | (2006.01) |
| *H04R 29/00* | (2006.01) |

(52) U.S. Cl.
CPC .......... *H03F 1/0222* (2013.01); *H03F 3/187* (2013.01); *H03F 3/217* (2013.01); *H04R 3/00* (2013.01); *H04R 29/00* (2013.01); *H04R 2420/07* (2013.01)

(58) Field of Classification Search
CPC ........ H03F 1/0222; H03F 3/187; H03F 3/217; H04R 3/00; H04R 29/00; H04R 2420/07
See application file for complete search history.

(56) References Cited

U.S. PATENT DOCUMENTS

| | | | |
|---|---|---|---|
| 8,224,399 B2 | 7/2012 | Cheol et al. | |
| 8,494,027 B2 | 7/2013 | Bulled et al. | |
| 8,754,616 B2 | 6/2014 | Dhuyvetter et al. | |
| 8,867,761 B2 | 10/2014 | Lazar et al. | |
| 8,971,073 B2 | 3/2015 | Grant et al. | |
| 2006/0015199 A1 | 1/2006 | Ebi et al. | |
| 2008/0212820 A1* | 9/2008 | Park ...................... | H04B 1/034 381/370 |

(Continued)

FOREIGN PATENT DOCUMENTS

| | | |
|---|---|---|
| CN | 1607723 A | 4/2005 |
| CN | 102026061 A | 4/2011 |

(Continued)

OTHER PUBLICATIONS

International Search Report & Written Opinion for International Application No. PCT/IB2017/000444, Application Filing Date Mar. 31, 2017; dated Aug. 24, 2017. 7 pages.

*Primary Examiner* — Sonia L Gay
(74) *Attorney, Agent, or Firm* — Muncy, Geissler, Olds & Lowe, P.C.

(57) ABSTRACT

A dynamic boost audio system includes a booster circuit having a dynamically sliding power supply unit (PSU) capable of outputting power among a plurality of different power levels. The booster circuit is configured to identify a real-time audio level of an audio signal, and automatically adjust the power to the power level such that the audio signal is output in response to the real-time audio level.

12 Claims, 12 Drawing Sheets

(56) References Cited

U.S. PATENT DOCUMENTS

| | | |
|---|---|---|
| 2009/0323985 A1 | 12/2009 | Garudadri et al. |
| 2013/0049718 A1 | 2/2013 | Berkhout et al. |
| 2014/0077885 A1 | 3/2014 | Frium |
| 2014/0320197 A1 | 10/2014 | Berkhout et al. |
| 2015/0030183 A1* | 1/2015 | Pazhayaveetil ........ H03G 3/004 381/120 |
| 2016/0014495 A1* | 1/2016 | Grandt ................. H04R 1/1041 381/74 |

FOREIGN PATENT DOCUMENTS

| | | | |
|---|---|---|---|
| CN | 103686529 A | | 3/2014 |
| CN | 203608346 U | | 5/2014 |
| KR | 10119980055107 | * | 9/1998 |

* cited by examiner

|  | Ordinary DC-DC Booster System | Tymphany Dynamic Booster | Improvement in % |
|---|---|---|---|
| IDLE | 85mA | 30mA | 64% |
| 0.25 Watt x2 1Khz @4Ohm | 400mA | 290mA | 27.5% |
| 0.5 Watt x2 1Khz @4Ohm | 780mA | 510mA | 34.6% |

FIG. 7

BOOSTER CIRCUIT INCLUDING DYNAMICALLY SLIDING POWER SUPPLY UNIT

CROSS-REFERENCE TO RELATED APPLICATIONS

The present application claims priority to U.S. Provisional Application No. 62/315,959, filed on Mar. 31, 2016, the contents of which are incorporated by reference herein in its entirety.

BACKGROUND

Short-range wireless audio output devices, such as Bluetooth speakers, typically implement a single-cell battery to power a DC booster circuit to boost power applied at the power rails for achieving desired output ratings. However, traditional DC booster circuits reduce power efficiency in the range of 20% a 25%. The low power efficiency increases power consumption of small low-capacity batteries implemented in the short-range wireless devices, thereby resulting in battery sustainable ability that is typically unable to provide long audio play times.

SUMMARY

According to at least one non-limiting embodiment, a dynamic boost audio system includes a boost circuit having a dynamically sliding power supply unit (PSU) capable of outputting power among a plurality of different power levels, the boost circuit configured to identify a real-time audio level of an audio signal, and automatically adjust the power to the power level such that the audio signal is output in response to the real-time audio level.

The PSU is capable of increasing system power efficiency, thereby improving battery life. For instance, amplification of 1 Watt or less may be achieved, which provides sufficient average listening levels using efficient transducers. With those lower power levels at least one embodiment may exclude a direct-current booster since the battery voltage would be sufficient. Accordingly, the system efficiency and battery life will be increased.

In at least one embodiment of the invention, the booster circuit including a dynamically sliding PSU, referred to as "a dynamic boost circuit", reduces power waste by 25%, and produces less heat in idle and therefore has a lower idle power consumption compared to traditional DC booster circuits. Accordingly, a direct feed from the battery can be provided at low power levels, while also providing the ability to (instantly) boost the output to higher voltages when the audio amplitude increases (e.g., above one or more audio thresholds).

According to a non-limiting embodiment, a dynamic boost circuit provided based on a low-cost self-sustained (etc., no separate microcontroller unit (MCU)) is required) analogue concept circuit is provided. The dynamic boost circuit includes an automatically sliding PSU configured to dynamically slide between different power supply voltages based on the actual (i.e., real-time) music signal. For example, the sliding PSU dynamically samples or identifies the actual (i.e., real-time) music signal, and automatically slides to (e.g., selects) the PSU voltage capable of producing the higher output power required by the real-time music signal. The different power supply voltages may include, but are not limited to:

1. 0>1 Watt Battery Direct (3.7 VDC)
2. 1>3 Watt, Booster 6 VDC
3. 3>5 Watt, Booster 8.5 VDC According to at least one embodiment, a single-cell short-range wireless audio output device such as a Bluetooth speaker, for example, capable of outputting 2×10 watt (@ 4Ω) electrical power needs a DC-DC booster circuit to boost up the power amplifier voltage. DC-DC booster circuits, however, typically reduce efficiency in both DC-DC booster as the power amplifier, and also result in higher heat dissipation.

According to at least one embodiment, the booster circuit including a dynamically sliding PSU dynamically outputs (i.e., automatically selects) a higher voltage than the single cell battery can deliver when the music level demands higher output power. The booster circuit including the dynamically sliding PSU, referred to as "dynamic boost circuit" effectively switches off the DC-DC booster at idle and lower listening levels. This is achieved by an analog current-to-direct current (AC/DC) averaging circuit that monitors the music signal. When the booster feature is not needed, booster circuit is essentially deactivated, and the battery output is fed directly to the amplifier.

However, when the music signal level exceeds a fixed pre-set value, it enables the DC-DC Booster. Signals with music levels that require output power below 2×0.8 Watt (@4 Ohm) will switch the system into "battery direct" mode.

In at least one embodiment, the dynamic boost circuit includes an additional attack/release time circuit that holds a time window that defines how long the music should stay a sustained level. The attack/release time circuit provides various features including, but not limited to, improved efficiency at idle, i.e., 64% (e.g., no music playing), improved efficiency at 2×0.25 Watt (W); 4 Ohm (Ω): 27.5%, and improved efficiency at 0.5 W; 4Ω: 34.6%.

According to another non-limiting embodiment, a method of dynamically adjusting power consumption of a boost audio system comprises identifying a real-time audio level of an audio signal, the audio signal having a plurality of different audio levels during a given time period. The method further comprises automatically adjusting the power to a power level generated by the boost audio system such that the audio signal is output in response to the real-time audio level at a given time during the time period.

For a better understanding of the invention with the features, refer to the description and the various non-limiting embodiments illustrated in the drawings.

BRIEF DESCRIPTION OF THE DRAWINGS

FIGS. 2-1 and 2-2 are a schematic diagram of a dynamic boost audio system audio system that implements a booster circuit including a dynamically sliding PSU according to a non-limiting embodiment;

DETAILED DESCRIPTION

Figure 1:
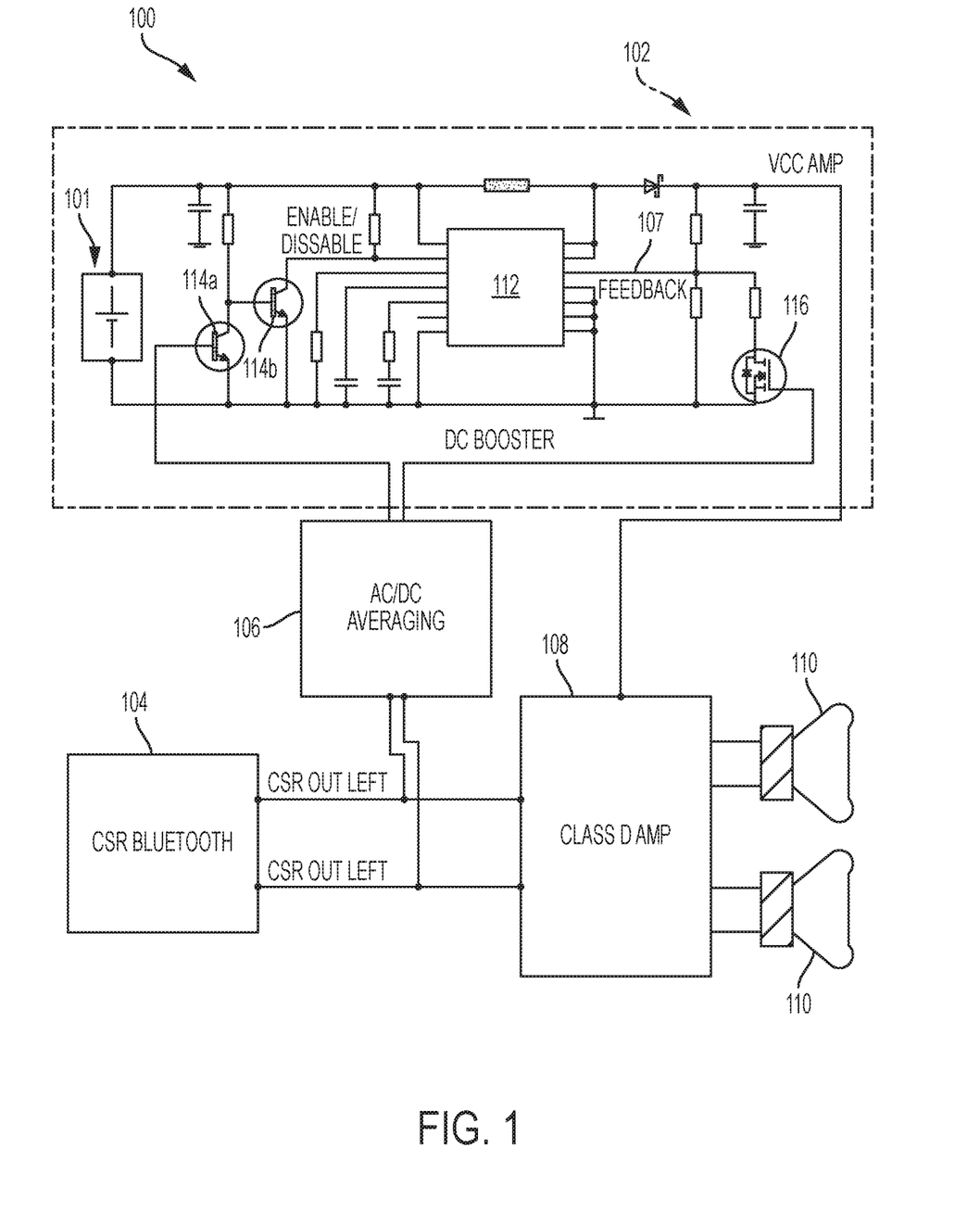
FIG. 1 is a block diagram of a dynamic boost audio system that implements a boost circuit including a dynamically sliding PSU according to a non-limiting embodiment.
Figure 2:
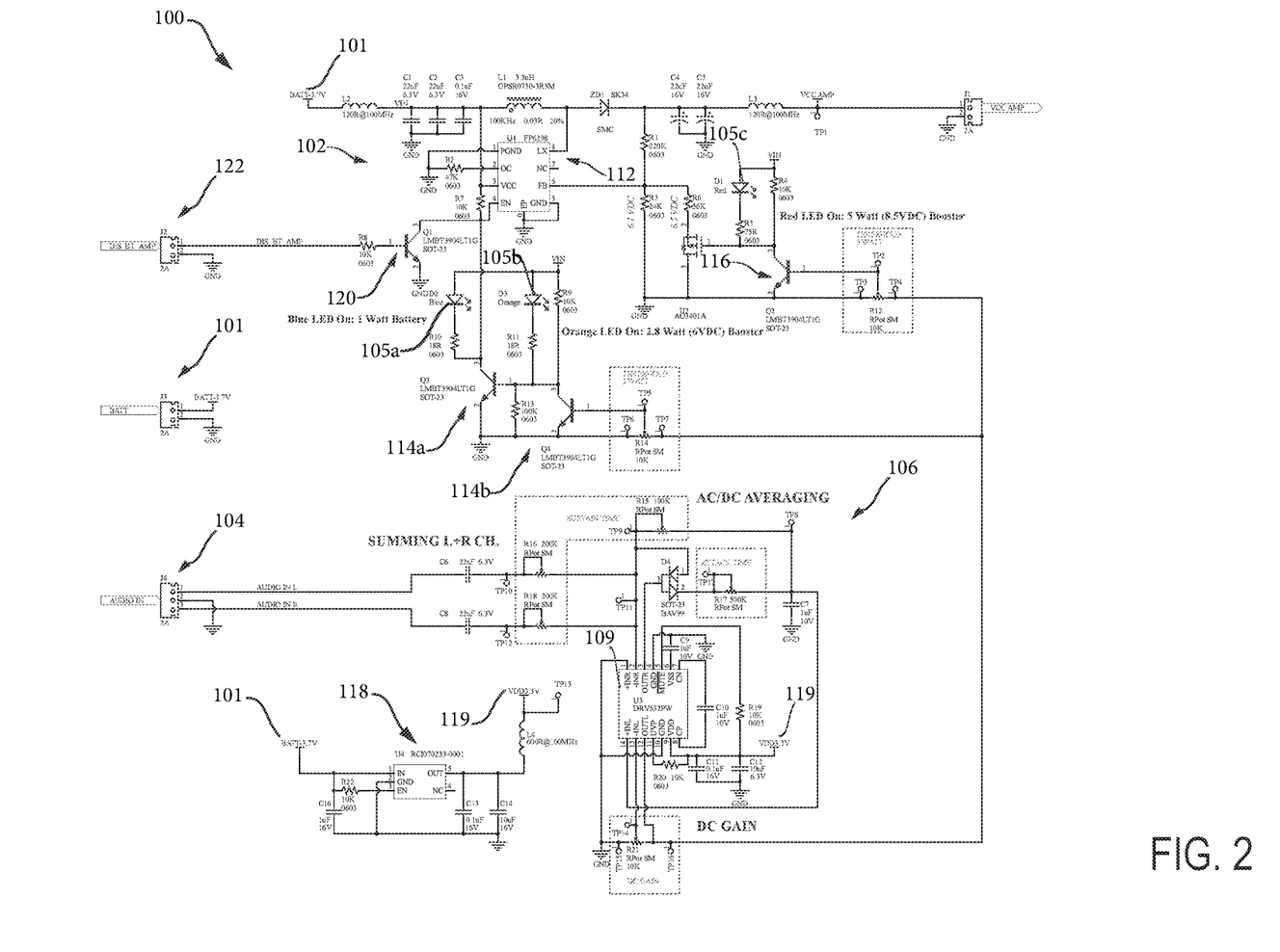
Figure 21:
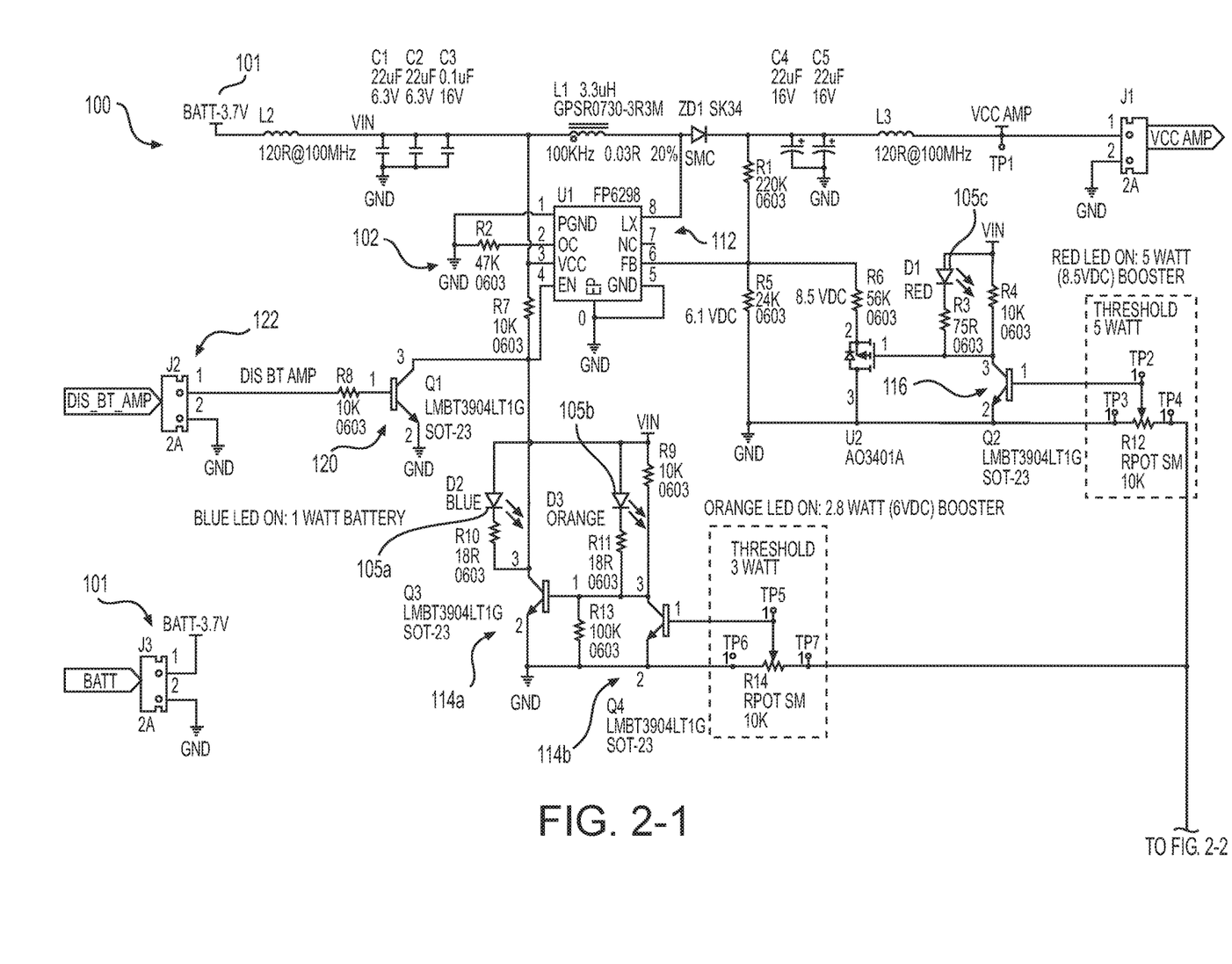
Figure 22:
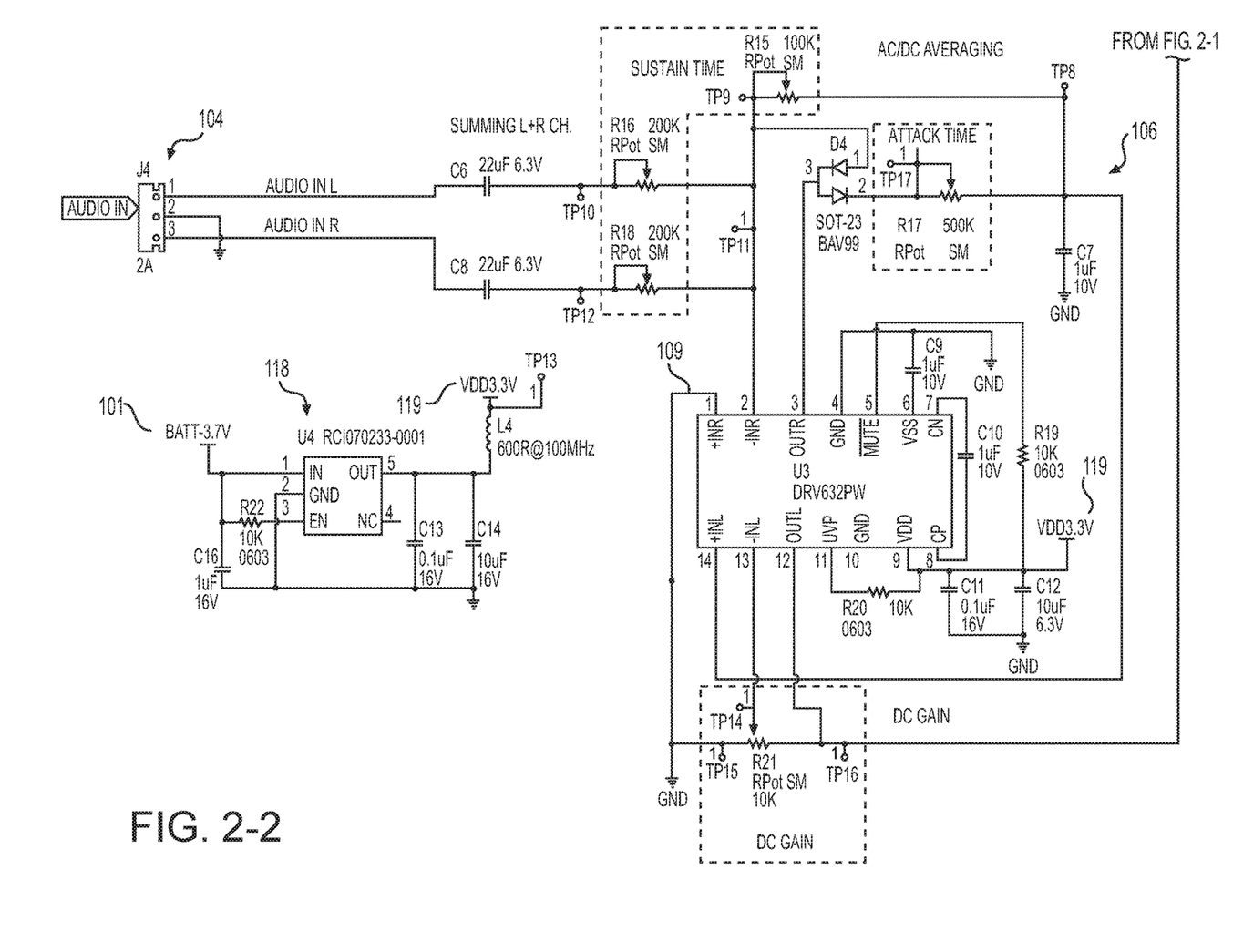

With reference now to FIG. 1, a dynamic boost audio system 100 is illustrated according to a non-limiting embodiment. Further structural details of the dynamic boost audio system 100 are illustrated in the circuit diagram shown in FIGS. 2-1 and 2-2. The dynamic boost audio system 100 includes a booster circuit 102 including a dynamically sliding PSU. The dynamic boost audio system 100 further includes a short-range wireless audio module 104, a rectifying circuit 106, and an amplifier circuit 108. The amplifier circuit 108 is connected to one or more audio output devices 110 such as, for example, Bluetooth speakers or headphones, for outputting audio therefrom.

The short-range wireless audio module 104 may include various integrated chips (ICs) that include circuits configured to provide data and voice communications. The short-range wireless audio module 104 may integrate a radio frequency (RF) and baseband controller capable of interfacing with a host via an interface such as, for example, a universal serial bus (USB) or universal asynchronous receiver/transmitter (UART). In at least one embodiment, the short-range wireless audio module is a CSR35XX Bluetooth integrated circuit (IC) chip.

The audio output of the short-range wireless audio module 104 is sampled and rectified to a DC level by the rectifier circuit 106. The rectifier circuit 106 may include an AC/DC converter circuit and averaging circuit. When no power boost is needed, the booster feature provided by the booster circuit 102 is essentially disabled, and the battery output is fed essentially directly to the amplifier 110.

When the booster feature is needed, the DC signal output by the rectifier circuit 106 is delivered to booster circuit 102 and drives the base of transistors 114a/114b to dynamically switch the booster circuit 102 between different power levels based on a required audio level of the audio signal. The music level of the music signal may dynamically change over time. Therefore, the system 100 is configured to dynamically (i.e., automatically) adjust the output power level necessary to satisfy the power demands of the dynamically changing audio levels of the audio signal. Accordingly, the booster circuit 102 can output a power level according to the output of the battery 103 when the real-audio level is at a first audio level, and can amplify the power level of the battery 103 to generate a second increased power level when the real-audio level exceeds an audio level threshold. Further structural details of the booster circuit 102 are illustrated in the circuit diagram shown in FIG. 3.

In at least one embodiment, the rectifier circuit 106 can be custom configured with specific "attack" and "sustain" times. For example, how quick the PSU switches to the next mode (e.g. from 3 watt to 5 watt) and how long does it stays at a given level, e.g., a time existing from 0 to 0.8 watt.

The booster circuit 102 may include a converter circuit 112 that includes a pulse width modulation (PWM) circuit configured to boost the output signal (e.g., current and/or voltage) from a first level to a higher second level. This converter circuit may be referred to as a DC booster circuit. When more power is required, the booster circuit 102 is "enabled", i.e., enabled to boost the output power, by driving its transistor circuit (e.g., first and second transistor 114a/114b) that pulls up an enable/disable pin of the converter circuit 112.

The converter circuit 112 further includes a feedback network 107 configured to compare the output of the rectifier circuit 106 to a maximum power threshold value. In at least one embodiment, the power level of the real-time music level of the music signal may be determined based on the output of the rectifier circuit 106. The converter circuit 112 may be pre-stored with a look-up table (LUT) indexed with required power levels that correspond to music levels. Accordingly, the converter circuit 112 may use the feedback network 107 to sample the real-time music level and determine the necessary power level to be automatically selected (i.e., the sliding power level).

When the converter chip 112 determines that maximum power is required (e.g., the audio level exceeds a max power audio level threshold), a switch, e.g., FET 116, is active to change the resistor-dividing ratio in the feedback network 107 of the DC booster circuit 102 to generate the third PSU voltage of 8.5 VDC. When the music amplitudes decrease, the amplifier automatically slides back to the next required PSU voltage. When a boost is no longer needed, the booster circuit 102 is deactivated, i.e., the transistors 114a/114b are switched off, and the battery output is fed directly to the amplifier 108. It may be appreciated that when the booster circuit is deactivated, the output of the battery is delivered to the amplifier 108, while being allowed to by-pass the booster circuitry.

The dynamic boost audio system 100 may further include a low drop out (LDO) voltage regulator 118, and an external amplifier switch 120. The LDO voltage regulator 118 operates to regulate the single-cell battery voltage (e.g., 3.7 VDC) to generate stable voltage (e.g., 3.3 VDC). This stable voltage signal 119 is then utilized to power various components of the system 100 such as, for example, the line driver 109. The stable signal can also power various circuits and systems of the 104 such as, for example, a digital signal processor (DSP), amplifier power supply, etc.

The external amplifier switch 120 can enable or disable the amplifier feature of the booster circuit 102 (i.e., enable or disable the converter chip 112), based on an external command signal. The external command signal may be output, for example, from the short-range wireless audio module, or another external device.

Figure 4:
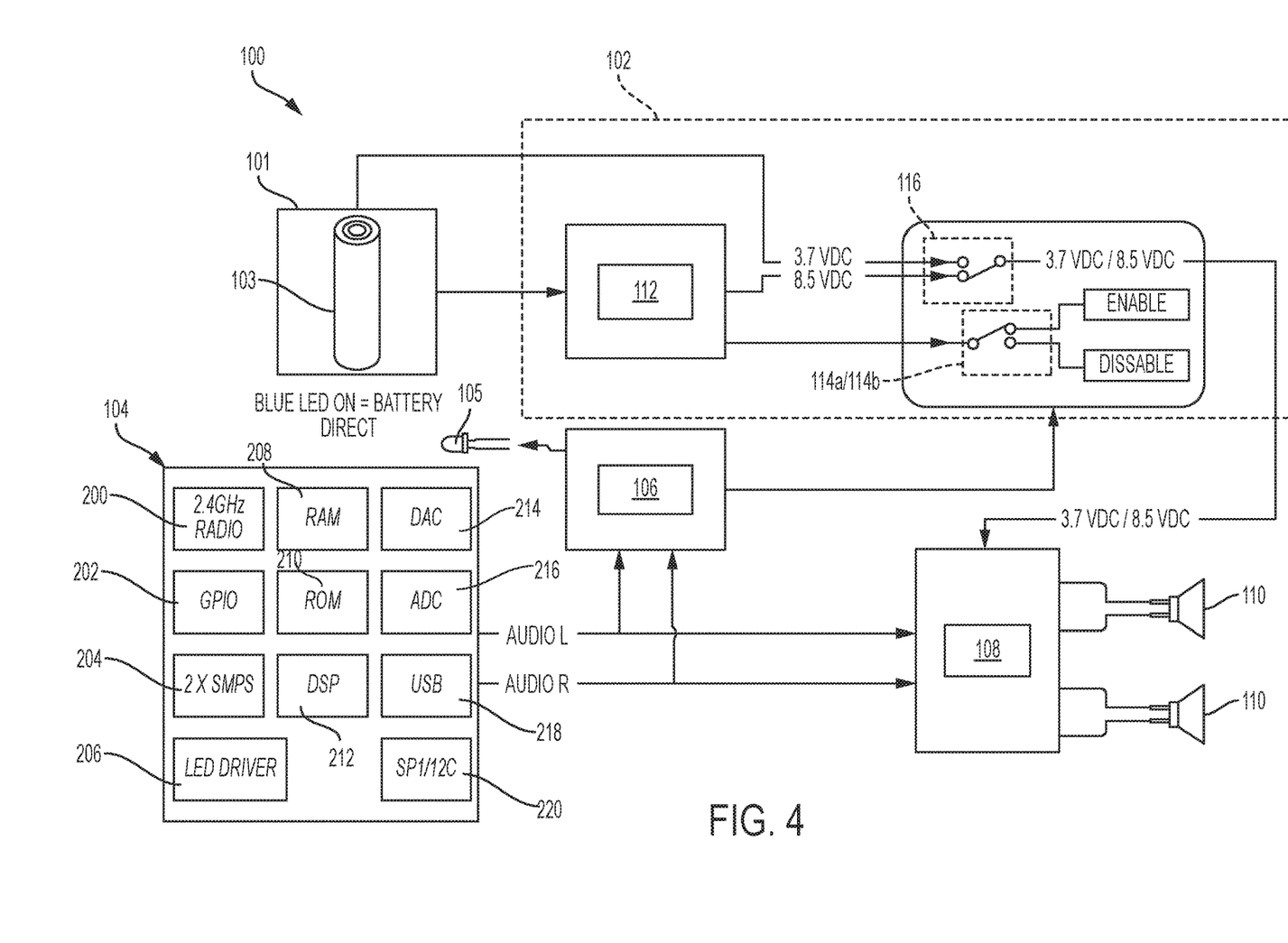
FIG. 4 is another block diagram of the dynamic boost audio system audio system to a non-limiting embodiment.

Turning to FIG. 4, a dynamic boost audio system 100 is illustrated according to a non-limiting embodiment. The dynamic boost audio system 100 includes a power source 101 in electrical communication with a booster circuit 102 including a dynamically sliding PSU. The power source 101 includes, for example, a battery 103. The booster circuit 102 operates as described above, and therefore details of its operation will not be repeated.

The dynamic boost audio system 100 further includes a short-range wireless audio module 104, a rectifying circuit 106, and an amplifier circuit 108. The short-range wireless audio module 104 can be constructed, for example, as a Bluetooth® audio controller that provides a hardware process embedded flash memory, and is capable of performing ultra-low power digital signal processing. The short-range wireless audio module 104 also can implement a high-performance stereo codec, and a power management subsystem.

The short-range wireless audio module 104 can also include various sub-modules including, but not limited to, a radio transceiver 200, a general-purpose input/output (GPIO) module 202, one or more switch-mode power supplies (SMPS) 204, one or more LED drivers 206, a random access memory (RAM) unit 208, a read-only memory (ROM) unit 210, a digital signal processor (DSP) 212, a digital-to-analog converter (DAC) 214, an ADC 216, a universal serial bus (USB) 218, and one or more serial communication bus modules 220.

The radio transceiver 200 can exchange data over short distances. e.g., using short-wavelength UHF radio waves in the ISM band from 2.4 to 2.485 GHz, from fixed and mobile devices, and building personal area networks (PANs).

The GPIO 202 is configured to receive inputs signals or deliver output signals. The SMPS 204 can be constructed as a power supply that incorporates a switching regulator to convert electrical power efficiently.

The SMPS 204 can transfer power from a DC source or AC source, to one or more DC loads, while converting voltage and current characteristics.

The LED driver 206 can be constructed as electrical circuit which regulates the power to an LED 105 or a string (or strings) of LEDs. In a non-limiting embodiment, a first LED 105a (e.g., blue LED) can be activated when booster circuit 102 outputs the power level provided by the power source 101 (e.g. 1 W power output by the battery 103) directly to the amplifier 108, a second LED 105b (e.g., an orange LED) can be activated when the booster circuit 102 outputs a first increased power level (e.g., 2.5 W; 6 VDC) in response to the audio level exceeding a first audio threshold, and a third LED 105c (e.g., a red LED) can be activated when the booster circuit 102 outputs a first increased power level (e.g., 5 W; 8.5 VDC) in response to the audio level exceeding a second audio threshold. In this case, the second audio threshold is greater than the first audio threshold, and the second increased power level is greater than the battery output power and the first increased power level.

The DSP 212 is constructed as an electrical circuit configured to measure, filter and/or compress continuous real-world signals such as, for example, analog signals.

The DAC 214 can be constructed as an electrical circuit that converts a digital input signal into an analog output signal. Similarly, the ADC 216 can be constructed as an electrical circuit that converts an analog input signal into a digital output signal.

The USB 218 provides an interface to connect various hardware devices to the short-range wireless audio module 104.

The rectifying circuit 106 can include analog-to-digital averaging circuit, and is capable of performing audio level detection operations.

The serial communication bus modules 220 can be constructed as a Serial Peripheral Interface SPI (bus) or an inter IC (I2C) bus. The serial communication bus modules 220 facilitate data communication, via serial data communication protocol, between devices connected to the short-range wireless audio module 104, or one or more integrated circuits (IC) implemented in the short-range wireless audio module 104.

The amplifier circuit 108 can be constructed as a class-D amplifier, or switching amplifier. The amplifier circuit 108 is connected to one or more audio output devices 110 such as, for example, Bluetooth speakers or headphones, for outputting audio therefrom. In at least one embodiment, a line driver circuit 109 (see FIGS. 2-1 and 2-2) is provided to reduce the level of noise received by the amplifier circuit 108. The line driver circuit 109 can also match the impedance of the amplifier circuit output to the characteristic impedance of a signal transmission line so that stereo audio output may be connected to an amplified speaker system.

The short-range wireless audio module 104 may include various integrated chips (ICs) that include circuits configured to provide data and voice communications. The short-range wireless audio module 104 may integrate a radio frequency (RF) and baseband controller capable of interfacing with a host via an interface such as, for example, a universal serial bus (USB) or universal asynchronous receiver/transmitter (UART). In at least one embodiment, the short-range wireless audio module is a CSR35XX Bluetooth integrated circuit (IC) chip.

The audio output of the short-range wireless audio module 104 is sampled and rectified to a DC level by the rectifier circuit 106. The rectifier circuit 106 may include an AC/DC converter circuit and averaging circuit. When no power boost is needed, the booster feature provided by the booster circuit 102 is essentially disabled, and the battery output is fed essentially directly to the amplifier circuit 110.

When the booster feature is needed, the DC signal output by the rectifier circuit 106 is delivered to booster circuit 102 and drives the switches 114a/114b to dynamically switch the booster circuit 102 between different power levels based on a required audio level of the audio signal. The music level of the music signal may dynamically change over time. Therefore, the dynamic boost audio system 100 is configured to dynamically (i.e., automatically) adjust the output power level necessary to satisfy the power demands of the dynamically changing audio levels of the audio signal.

Figure 5:
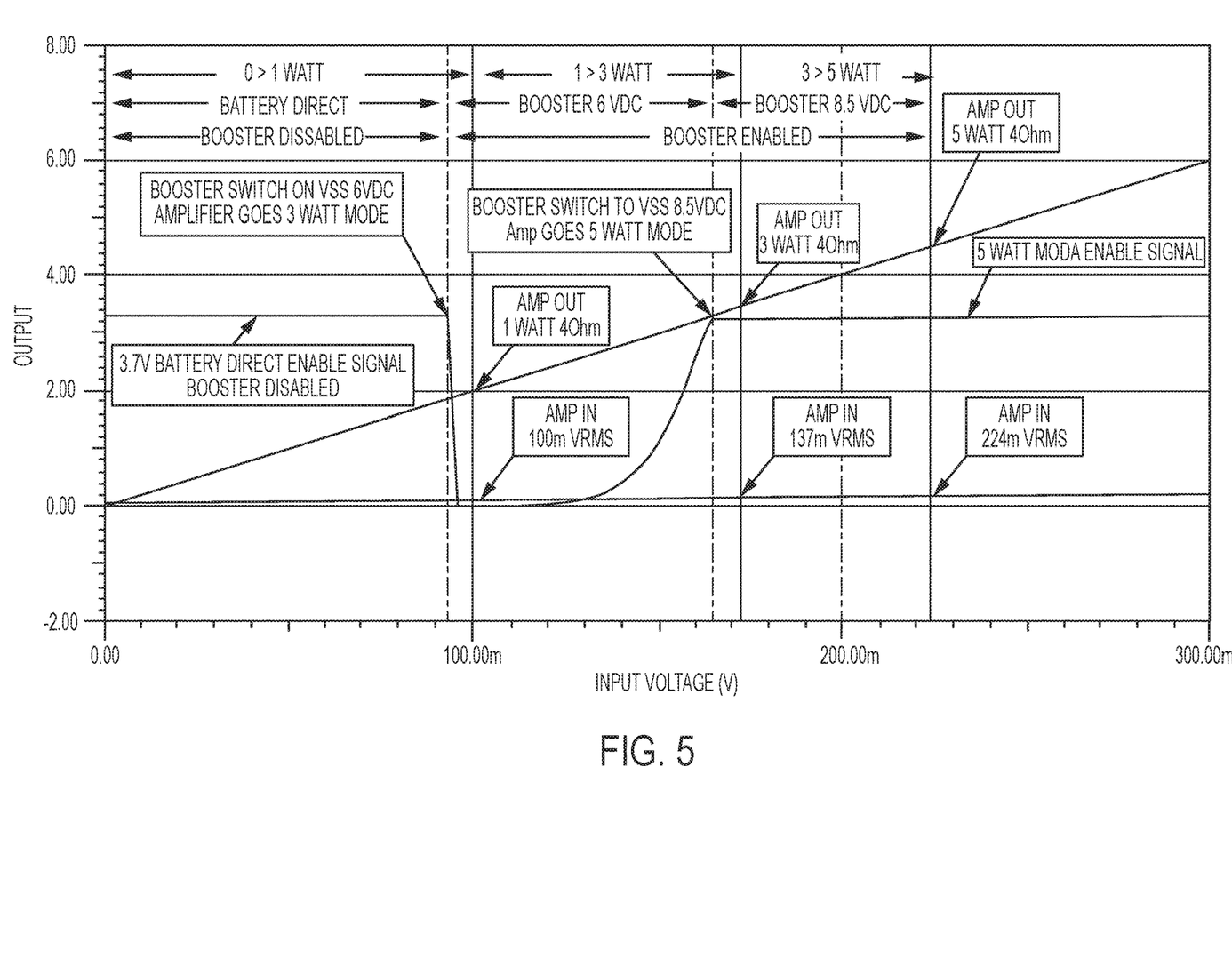
FIG. 5 is illustrates a simulation of the AC/DC averaging rectifier circuit with different values for different attack and sustain times.
Figure 6:
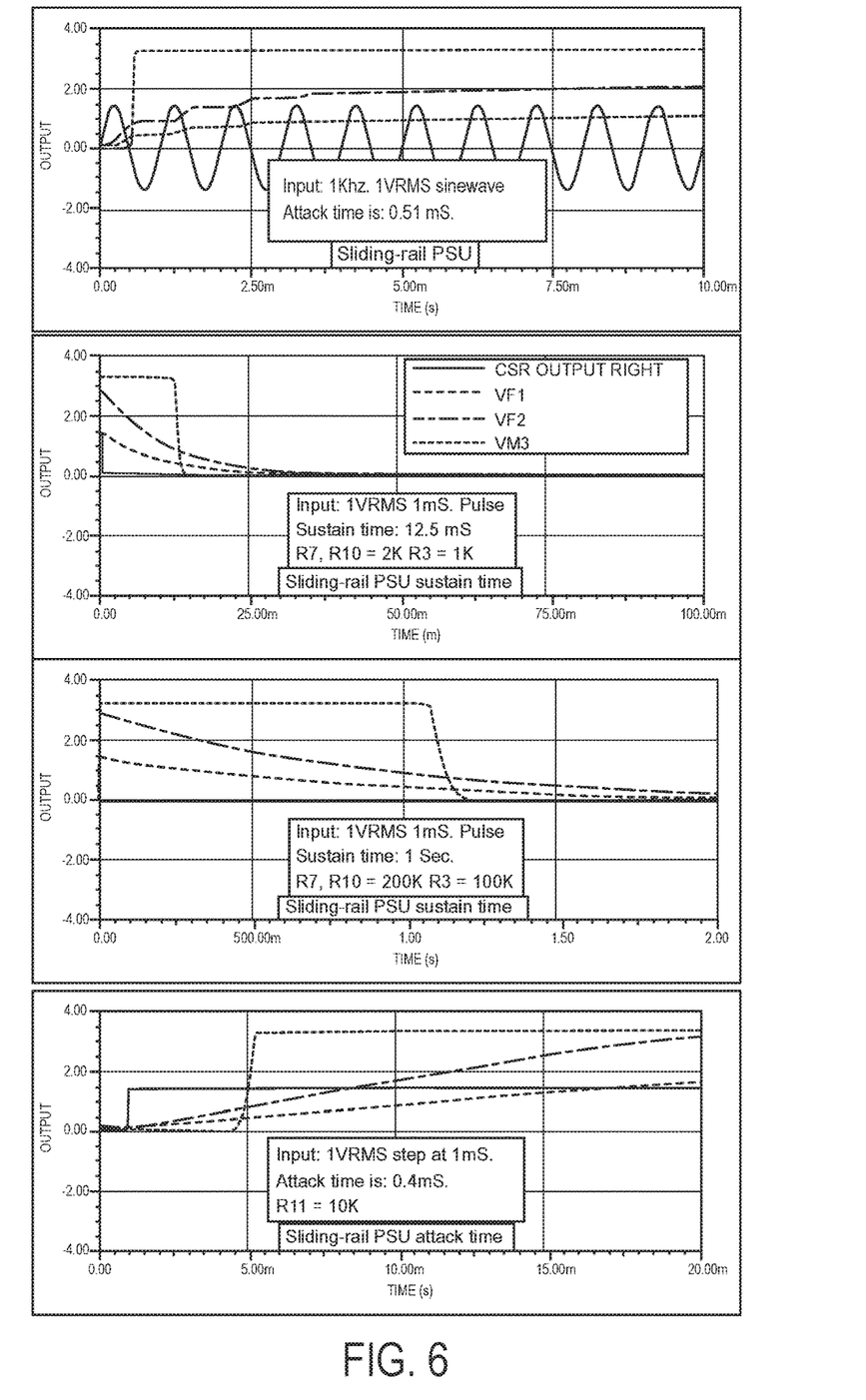
FIG. 6 illustrates transition tables corresponding to the different PSU levels.
Figure 7:
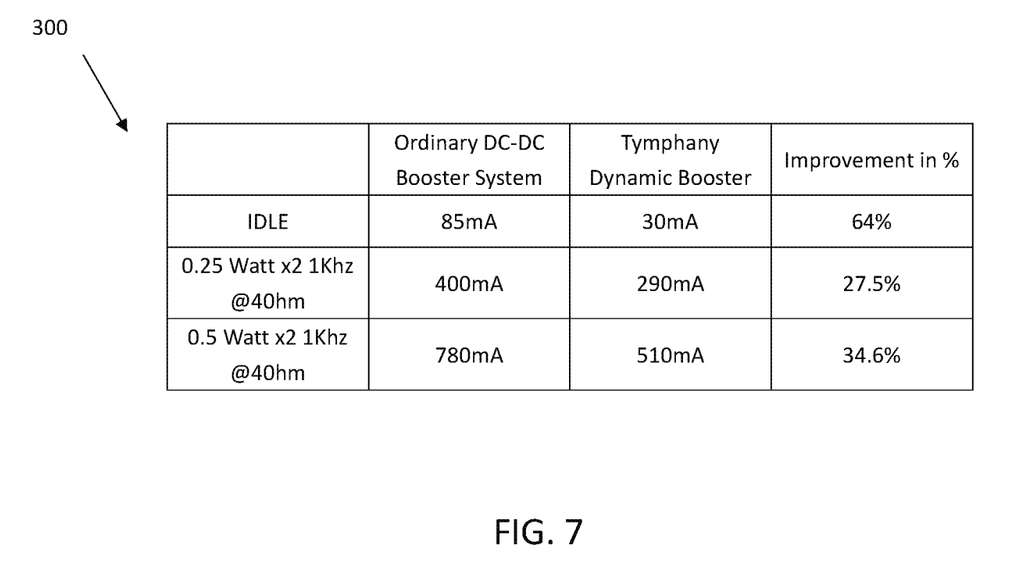
FIG. 7 is a table illustrating an example of performance results provided by the dynamic booster according to a non-limiting embodiment.

In at least one embodiment, the rectifier circuit 106 can be custom configured with specific "attack" and "sustain" times. For example, the rectifier circuit can detect an audio level of the signal, and determine how quick the PSU switches to the next mode (e.g. from 3 watt to 5 watt) and how long does it have to stay on this level, e.g., a time existing from 0 to 0.8 watt. FIG. 5 is illustrates a simulation of the AC/DC averaging rectifier circuit with different values for different attack and sustain times according to the different operating modes of the system 100.

As discussed above, the booster circuit 102 can boost the output signal (e.g., current and/or voltage) from a first level to a higher second level. This converter circuit may be referred to as a DC booster circuit. When more power is required, the booster circuit 102 operates the switches 114a/114b to boost the output power.

The feedback network 107 described above allows the booster circuit 102 to compare the output of the rectifier circuit 106 to a maximum power threshold value. In at least one embodiment, the power level of the real-time music level of the music signal may be determined based on the output of the rectifier circuit 106. Accordingly, the booster circuit 102 may use the feedback network to sample the real-time music level and determine the necessary power level to be automatically selected (i.e., the sliding power level).

When the booster circuit 102 determines that maximum power is required, switch 116 can be operated to change the resistor-dividing ratio in the feedback network of the DC booster circuit 102 to generate the third PSU voltage of 8.5 VDC. When the music amplitudes decrease, the amplifier automatically slides back to the next required PSU voltage. When a boost is no longer needed, the booster circuit 102 is deactivated, i.e., the switches 114a/114b are switched off, and the battery output is fed directly to the amplifier 108. It may be appreciated that when the booster circuit is deactivated, the output of the battery is delivered to the amplifier 108, while being allowed to by-pass the booster circuitry.

Figure 3:
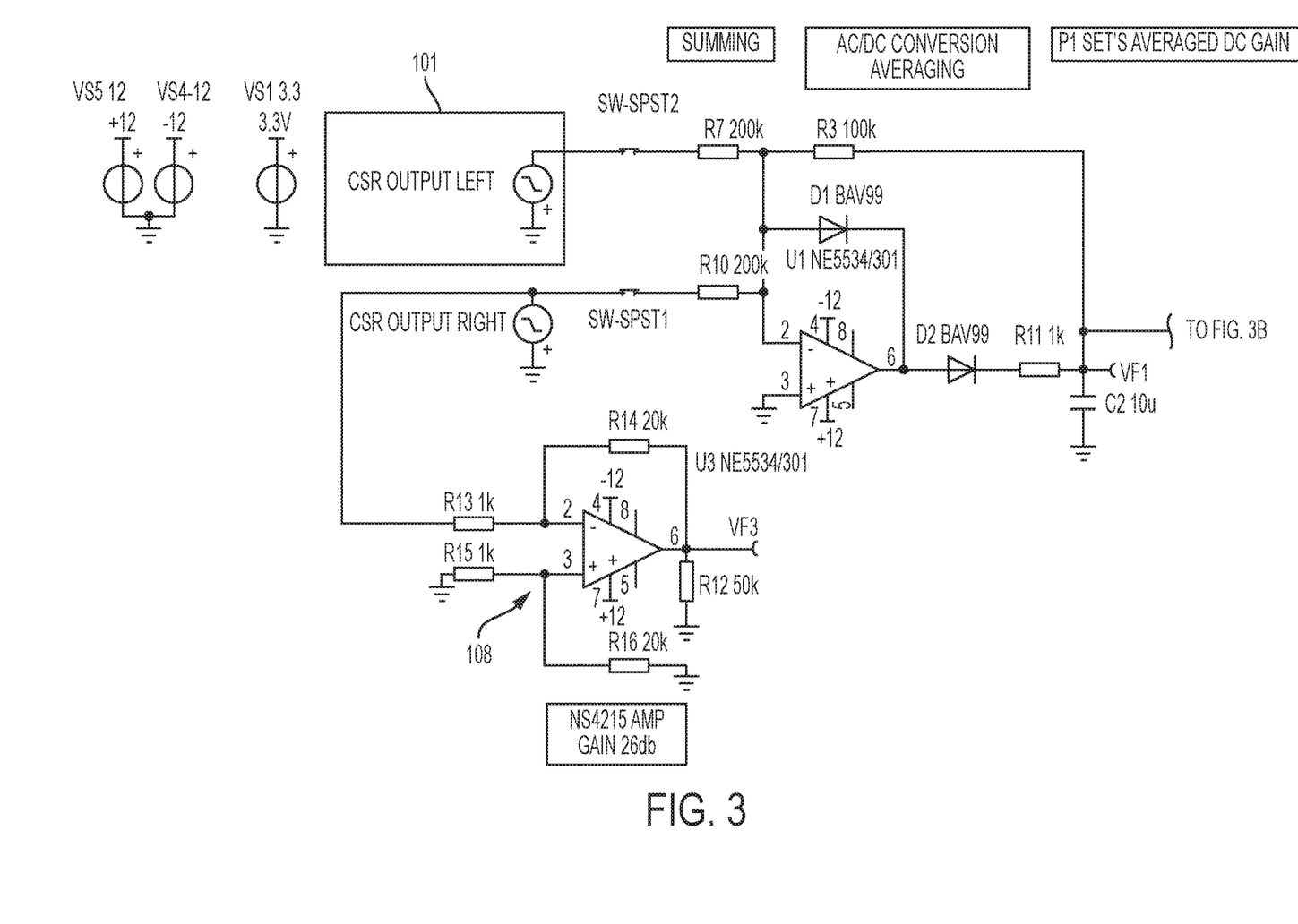
FIG. 3 is a schematic diagram of a booster circuit including a dynamically sliding PSU according to a non-limiting embodiment.

The table 300 illustrated in FIG. 3 presents an example of performance results provided by the dynamic booster according to a non-limiting embodiment. In this example, the amplifier was implemented as a NS4215 class D amplifier (no output filtering), the booster was implemented as a FP6288X-G1 DC-DC booster, and the operation amplifier was implemented as a DRV632PW OP-AMP+LDO. The dummy amplifier load (2×4Ω) was also implemented. At idle, the dynamic booster according to the inventive teachings consumes 30 mA, while conventional DC-DC booster systems consume 85 mA. Accordingly, the dynamic booster according to various non-limiting embodiments recited herein can provide an improvement of approximately 64%. When operating at 0.25 Watts, the dynamic booster according to the inventive teachings consumes 290 mA, while conventional DC-DC booster systems consume 400 mA. Accordingly, the dynamic booster according to various non-limiting embodiments recited herein can provide an improvement of approximately 27.5%. When operating at 0.5 Watts, the dynamic booster according to the inventive teachings consumes 510 mA, while conventional DC-DC booster systems consume 780 mA. Accordingly, the dynamic booster according to various non-limiting embodiments recited herein can provide an improvement of approximately 34.6%.

As used herein, the term "module" refers to an application specific integrated circuit (ASIC), an electronic circuit, an electronic computer processor (shared, dedicated, or group) and memory that executes one or more software or firmware programs, a combinational logic circuit, and/or other suitable components that provide the described functionality. When implemented in software, a module can be embodied in memory as a non-transitory machine-readable storage medium readable by a processing circuit and storing instructions for execution by the processing circuit for performing a method.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A dynamic boost audio system, comprising:
   a booster circuit including a direct current-to-direct current (DC-DC) voltage converter circuit and a dynamically sliding power supply unit (PSU) capable of outputting power among a plurality of different power levels, the booster circuit configured to identify a real-time audio level of an audio signal, and automatically adjust the power to a selected power level among the different power levels such that the audio signal is output based on the real-time audio level;
   a rectifier circuit in signal communication with the booster circuit, the rectifier circuit configured to rectify the audio signal to generate a direct current (DC) audio signal that is delivered to the booster circuit;
   a feedback network in signal communication with the rectifier circuit to feedback the DC audio signal to the PSU;
   a power supply connected to the booster circuit, wherein the booster circuit operates in a first state to establish a first circuit path that by-passes the DC-DC converter circuit so as to output the power according to a first power level generated by the power supply when the real-audio level is at a first audio level, and operates in a second state that establishes a second circuit path that connects the DC-DC converter to the power supply, wherein the DC-DC converter increases the first power level to generate a second power level when the real-audio level exceeds a first audio level threshold,
   wherein the PSU identifies the real-time audio level of an audio signal based directly on an amplitude of DC audio signal, and selects the first circuit path to provide the first power level or the second circuit path to provide the second power level according to the real-time audio level of the DC audio signal.

2. The dynamic boost audio system of claim 1, further comprising an amplifier circuit that drives at least one audio output device.

3. The dynamic boost audio system of claim 1, wherein the dynamic boost audio system further comprises:
   a short-range wireless audio module that outputs an audio output signal; and
   wherein an output of the a rectifier circuit is in signal communication with the short-range wireless audio module and rectifies the audio output signal.

4. The dynamic boost audio system of claim 3, wherein the booster circuit outputs the first power level directly to the amplifier circuit in response to the audio level being less than or equal to the audio level threshold.

5. The dynamic boost audio system of claim 4, wherein, in response to the audio level exceeding the audio level threshold, the booster circuit generates the second power level based on the DC audio signal output by the rectifier circuit.

6. The dynamic boost audio system of claim 5, wherein the plurality of different power levels includes the first power level output by the power supply when the audio level is equal to or less than the first audio level threshold, a second increased power level generated by the booster circuit when the audio level exceeds the first audio level threshold, and a third increased power level generated by the booster circuit when the audio level exceeds a second audio level that is greater than the first audio level, wherein the third increased power is greater than the first power level and the second power level.

7. A method of dynamically adjusting power consumption of a boost audio system, the method comprising:
   identifying a real-time audio level of an audio signal, the audio signal having a plurality of different audio levels during a given time period; and
   automatically adjusting the power to a power level generated by the boost audio system such that the audio signal is output in response to the real-time audio level at a given time during the time period, wherein automatically adjusting the power further comprises:
   rectifying the audio signal output to generate a direct current (DC) audio signal, and delivering the DC audio signal to a booster circuit that includes a DC-DC converter;
   feeding the DC audio signal back to a dynamically sliding power supply unit (PSU);
   identifying the real-time audio level of an audio signal based directly on an amplitude of DC audio signal, and selecting one of a first signal path that bypasses the DC-DC converter so as to provide the first power level, and a second signal path that connects the power supply to the DC-DC converter so as to provide the a second power level according to the real-time audio level of the DC audio signal;
   in response to establishing the first signal path, outputting the power according to a first power level generated by the power supply when the real-audio level is at a first audio level; and in response to establishing the second signal path, increasing the first power level to achieve the second power level when the real-audio level exceeds a first audio level threshold.

8. The method of claim 7, further comprising driving at least one audio output device using the amplifier circuit.

9. The method of claim 8, further comprising:
outputting an audio output signal via a short-range wireless audio module.

10. The method of claim 9, further comprising outputting the first power level directly to the amplifier circuit in response to the audio level being less than or equal to the audio level threshold.

11. The method of claim 10, further comprising generating, via the booster circuit, the second power level based on the DC signal output by the rectifier circuit, in response to the audio level exceeding the audio level threshold.

12. The method of claim 11, further comprising outputting the first power level output by the power supply when the audio level is less than or equal to the first audio level threshold, outputting a second increased power level generated by the booster circuit in response to the audio level exceeding the first audio level threshold, and outputting a third increased power level generated by the booster circuit in response to the audio level exceeding a second audio level that is greater than the first audio level, wherein the third increased power is greater than the first power level and the second power level.

* * * * *